(12) United States Patent
Hachuda

(10) Patent No.: US 10,044,127 B2
(45) Date of Patent: Aug. 7, 2018

(54) CONTACT PIN AND SOCKET FOR ELECTRICAL COMPONENT

(71) Applicant: ENPLAS CORPORATION, Kawaguchi-shi, Saitama (JP)

(72) Inventor: Osamu Hachuda, Kawaguchi (JP)

(73) Assignee: ENPLAS CORPORATION, Kawaguchi (JP)

( * ) Notice: Subject to any disclaimer, the term of this patent is extended or adjusted under 35 U.S.C. 154(b) by 0 days.

(21) Appl. No.: 15/445,185

(22) Filed: Feb. 28, 2017

(65) Prior Publication Data

US 2017/0250486 A1 Aug. 31, 2017

(30) Foreign Application Priority Data

Feb. 29, 2016 (JP) ................................. 2016-037969

(51) Int. Cl.
*H01R 13/60* (2006.01)
*H01R 13/24* (2006.01)
*H01R 12/71* (2011.01)

(52) U.S. Cl.
CPC ....... *H01R 13/2428* (2013.01); *H01R 12/716* (2013.01)

(58) Field of Classification Search
CPC H01R 13/24; H01R 13/2421; H01R 13/2428; H01R 43/16
USPC ..................... 439/533, 700, 482; 324/755.05
See application file for complete search history.

(56) References Cited

U.S. PATENT DOCUMENTS

| | | | | |
|---|---|---|---|---|
| 4,204,739 A | * | 5/1980 | Shoenleben | E21B 17/023 439/181 |
| 4,734,051 A | * | 3/1988 | Burns | H01R 13/7036 439/289 |
| 4,773,877 A | * | 9/1988 | Kruger | G01R 1/06722 324/755.05 |
| 4,778,404 A | * | 10/1988 | Pass | H01R 13/2428 439/246 |
| 5,967,856 A | * | 10/1999 | Meller | H01R 13/2428 439/700 |

(Continued)

FOREIGN PATENT DOCUMENTS

JP 2013-89373 5/2013

*Primary Examiner* — Abdullah Riyami
*Assistant Examiner* — Vladimir Imas
(74) *Attorney, Agent, or Firm* — Staas & Halsey LLP

(57) ABSTRACT

A contact pin to electrically connect a first electrical component to a second electrical component and contact with the first and second electrical components at a sufficiently large contact pressure. The contact pin includes a first plunger with a first contact portion and a second plunger with a second contact portion. An expandable meander portion is formed on the second plunger. A contact piece to conduct electricity between the first and second plungers is provided to guide the expanding and shrinking operation of the meander portion. The first and second plungers are conducted via the contact piece when the first electrical component is electrically connected to the second electrical component, and the meander portion is shrunk to bring the first contact portion of the first plunger and the second contact portion of the second plunger into contact with the first and second electrical components at a sufficiently large contact pressure.

3 Claims, 15 Drawing Sheets

(56) References Cited

U.S. PATENT DOCUMENTS

| | | | | |
|---|---|---|---|---|
| 6,358,097 B1* | 3/2002 | Peters | ............... | H01R 13/2428 439/700 |
| 6,402,567 B1* | 6/2002 | Zhu | ................... | H01R 13/2428 439/66 |
| 6,506,082 B1* | 1/2003 | Meek | ................ | H01R 13/2421 439/700 |
| 6,626,708 B2* | 9/2003 | Phillips | ............. | H01R 13/2428 439/515 |
| 6,720,781 B2* | 4/2004 | Ott | .................... | G01R 1/06716 324/755.05 |
| 6,783,405 B1* | 8/2004 | Yen | ................... | H01R 13/2428 439/700 |
| 7,955,122 B2* | 6/2011 | Tominaga | ......... | G01R 1/06716 324/755.05 |
| 9,322,846 B2 | 4/2016 | Sakai | | |
| 9,404,940 B1* | 8/2016 | Campbell | ......... | G01R 1/06788 |
| 9,742,090 B2* | 8/2017 | Tanaka | .................. | H01R 13/20 |
| 9,755,345 B2* | 9/2017 | Rosenberger | ..... | H01R 13/2428 |
| 2015/0280346 A1* | 10/2015 | Rosenberger | ......... | H01R 43/16 439/828 |

\* cited by examiner

CONTACT PIN AND SOCKET FOR ELECTRICAL COMPONENT

CROSS-REFERENCE TO RELATED APPLICATIONS

This application claims the foreign priority benefit under 35 U.S.C. § 119 of Japanese Patent Application No. 2016-037969, filed Feb. 29, 2016, the contents of which are incorporated herein by reference.

BACKGROUND OF THE INVENTION

Field of Invention

The present invention relates to a contact pin (a contact member) for electrically connecting first and second electrical components with each other, used as a probe for inspecting electrical components, for example, and a socket for the electrical components with the contact pin.

Description of the Related Art

Up to now, as the contact pin of this type, there has been known the one that stationary portion and movable portion are coupled together by a bellows which can expand and shrink in up and down directions and a stick-shaped movable contact piece is provided on the movable portion along the bellows to secure a desired conduction with a predetermined displacement ensured (refer to Japanese Patent Laid-Open No. 2013-89373, for example). In using the contact pin, the movable portion is depressed toward the stationary portion to shrink the bellows, bring the movable contact piece into contact with the stationary portion, and cause a short-circuit between them.

In such a contact pin, however, the bellows is liable to oscillate from side to side when shrunk. In this case, force for elastically urging the stationary and movable portions is decreased in the direction of separating them from each other to make insufficient a contact pressure between the first and second electrical components and the contact pin, which causes a problem that the first and second electrical components cannot be electrically and appropriately connected.

SUMMARY OF THE INVENTION

The present invention aims at providing a contact pin and a socket for electrical components which can avoid a situation where the first and second electrical components cannot be appropriately connected due to lack of contact pressure in electrically connecting the electrical components with each other.

To achieve the aim, a contact pin according to the present invention is configured to electrically connect a first electrical component to a second electrical component and includes: a first conductive plunger with a first contact portion which contacts with the first electrical component; and a second conductive plunger with a second contact portion which contacts with the second electrical component while being vertically movably supported with respect to the first plunger, in which an expandable/shrinkable meander portion configured to elastically urge the first and second plungers in the direction of separating the first and second plungers from each other is integrally formed in the second plunger, a bar shaped contact piece configured to conduct electricity between the first and second plungers is provided to guide the expanding and shrinking operation of the meander portion when the meander portion is expanded and/or shrunk; when the first electrical component is electrically connected to the second electrical component each other the first and second plungers are mutually conducted via the contact piece, and the meander portion is shrunk to produce a predetermined repulsive force, bringing the first contact portion of the first plunger and the second contact portion of the second plunger into contact with the first and second electrical components at a predetermined contact pressure respectively.

In the present invention, it is desirable that the first plunger includes a plunger main body substantially U-shaped in cross section, the contact piece is provided along the meander portion in the vicinity of an opening portion of the plunger main body, and the expansion and shrinkage operation of the meander portion is guided by surrounding four sides in the horizontal direction of the meander portion with the plunger main body and the contact piece when the meander portion is expanded and/or shrunk.

In the present invention, it is desirable that a lock portion is formed at the leading edge of the contact piece, a lockable portion is formed in the first plunger, the lock portion is locked by the lockable portion, an engaging portion is formed on one of the first or second plungers, an engageable portion is formed on the other thereof, and the engaging portion is engaged with the engageable portion to guide the vertical movement of the second plunger with respect to the first plunger.

The socket for electrical components according to the present invention is characterized in that a plurality of contact pins according to the present invention are arranged on a module main body.

According to the present invention, the first and second plungers are mutually conducted via the contact piece when the first electrical component is electrically connected to the second electrical component each other, and the expansion and shrinkage operation of the meander portion is guided by the contact piece when the meander portion of the second plunger is expanded and/or shrunk. Accordingly, the meander portion can be prevented from oscillating from side to side when the meander portion is shrunk. As a result, this can avoid such a situation that the electrical components cannot be appropriately connected to each other because of lack of contact pressure when the first and second electrical components are electrically connected by the contact pin.

According to the present invention, the expansion and shrinkage operation of the meander portion is guided by surrounding four sides in the horizontal direction of the meander portion by the plunger main body and the contact piece when the meander portion of the second plunger is expanded or shrunk, which can make it possible to more surely guide the expansion and shrinkage operation of the meander portion of the second plunger. For this reason, it is possible to avoid such a situation that the electrical components cannot be appropriately connected each other because of lack of contact pressure when the first and second electrical components are electrically connected by the contact pin.

According to the present invention, the engaging portion is engaged with the engageable portion to guide the vertical movement of the second plunger with respect to the first plunger, which enables the contact pin to be simply and accurately assembled.

Furthermore, according to the present invention, the socket for electrical components achieving the above effect can be provided.

DETAILED DESCRIPTION OF THE PREFERRED EMBODIMENT

The embodiment of the present invention is described below.

FIGS. 1 to 7B show a first embodiment of the present invention.

Figure 1:
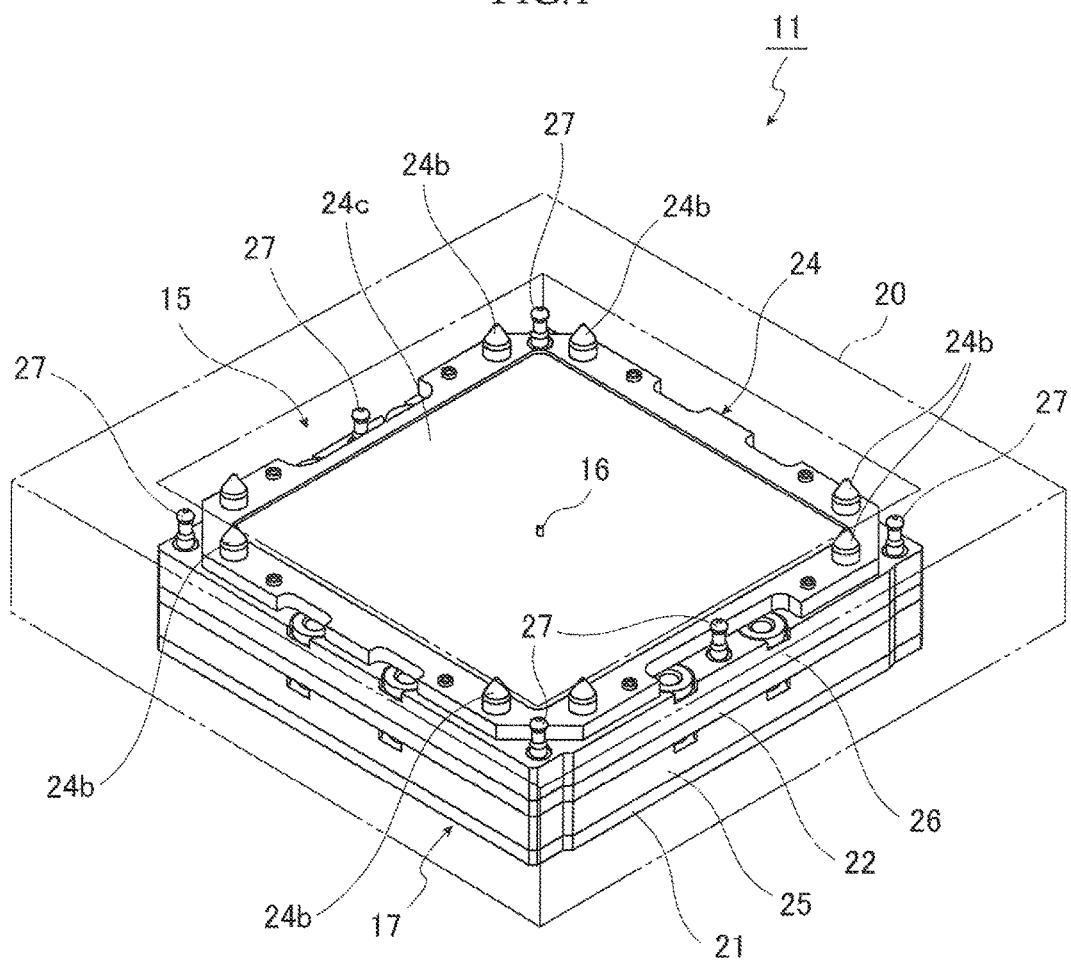
FIG. 1 is a perspective view showing a socket for electrical components according to a first embodiment of the present invention.

FIG. 1 shows an IC socket 11 being "a socket for electrical components" according to the first embodiment. The IC socket 11 is arranged on a wiring substrate 13 (refer to FIG. 6B) being a "first electrical component", and electrically connects a spherical terminal 12a of an IC package 12 being a "second electrical component" with a pad 13a of the wiring substrate 13. The IC package 12 is housed in the IC socket 11 to conduct a burn-in test for the IC package 12.

Figure 7A:
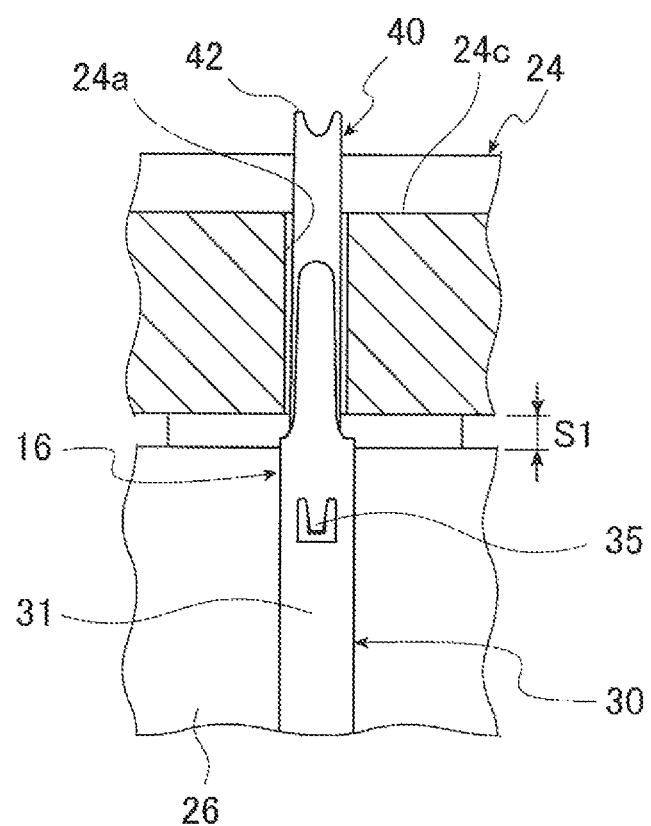
FIG. 7A is a longitudinal section showing a state where a second contact portion of a second plunger is projected when the socket for electrical components according to the first embodiment is used and shows a state where the floating plate is elevated with respect to an upper plate.
Figure 7B:
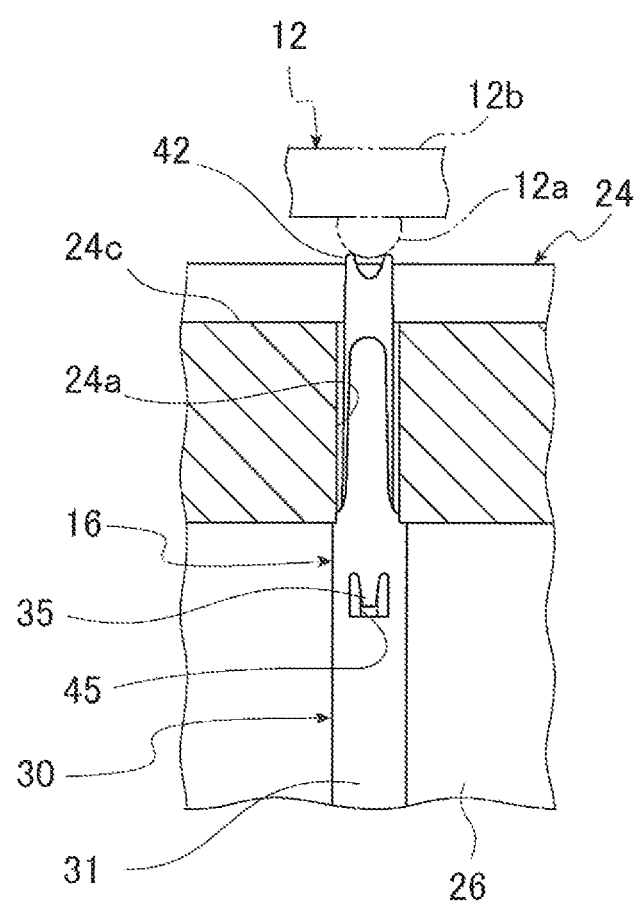
FIG. 7B is the longitudinal section showing a state where the second contact portion of the second plunger is projected when the socket for electrical components according to the first embodiment is used and shows a state where the floating plate and the second plunger are lowered with respect to the upper plate.

The IC package 12 is called a ball grid array (BGA) type, includes a package main body 12b with a square shape when viewed from the top and is configured such that a plurality of spherical terminals 12a (refer to FIG. 7B) are arranged in a lattice shape on the lower surface of the package main body 12b and projected downward. In FIG. 7B, only one of the plurality of spherical terminals 12a is shown.

As shown in FIG. 1, the IC socket 11 includes a contact module 15 and a socket base 20. The contact module 15 accommodates the IC package 12 (refer to FIG. 7B). The socket base 20 is approximately square-shaped and arranged on the wiring substrate 13 (refer to FIG. 6B) with the contact module 15 inserted from the downward into the socket base 20 and attached thereto.

Figure 2A:
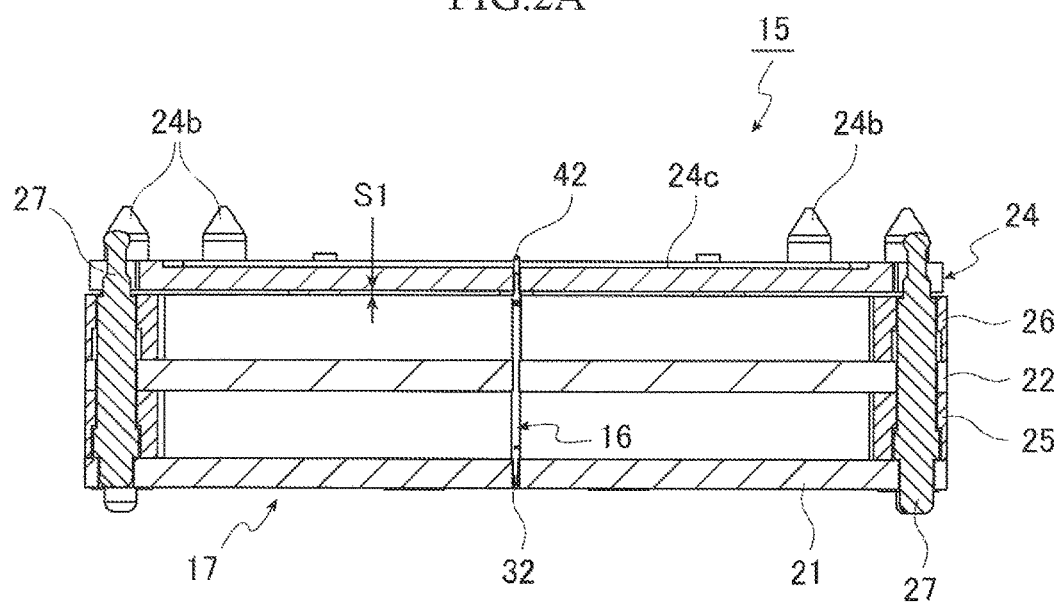
FIG. 2A is a longitudinal section showing a contact module according to the first embodiment and shows a state where a floating plate is elevated.
Figure 2B:
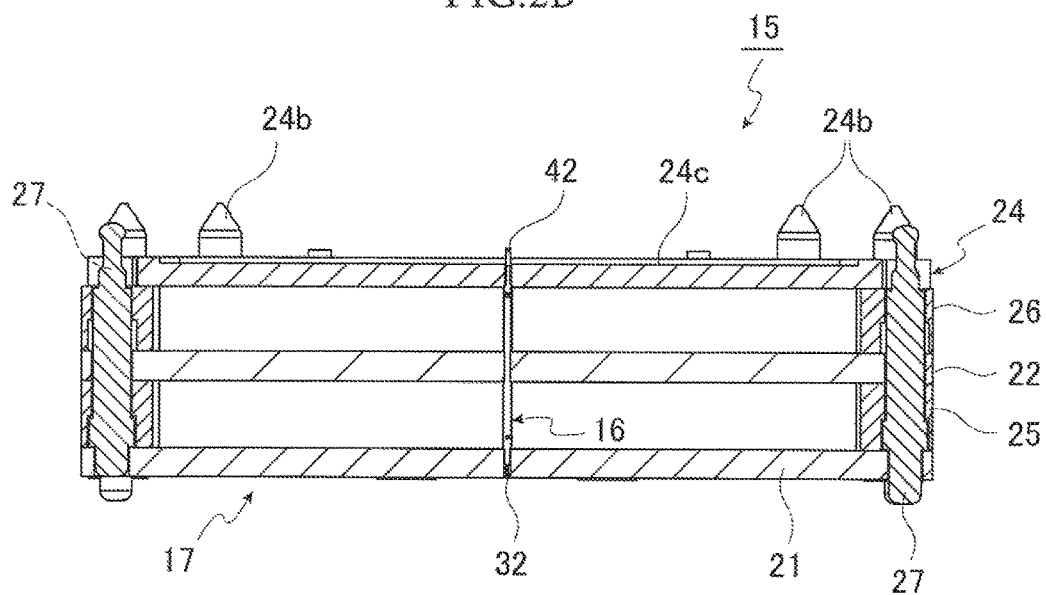
FIG. 2B is the longitudinal section showing the contact module according to the first embodiment and shows a state where the floating plate is lowered.

As shown in FIGS. 2A and 2B, the contact module 15 includes a module main body 17 on which a plurality of contact pins 16 are arranged upward and downward in an elastically expandable/shrinkable manner. In FIG. 2, only one of the plurality of contact pins 16 is shown.

Figure 6A:
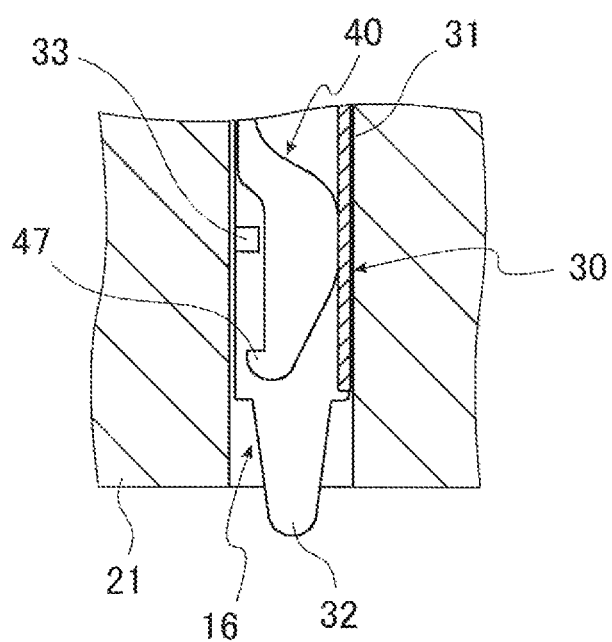
FIG. 6A is a longitudinal section showing a state where a first contact portion of the first plunger is projected when the socket for electrical components according to the first embodiment is used and shows a state where the socket for electrical components is not yet arranged on a wiring substrate.
Figure 6B:
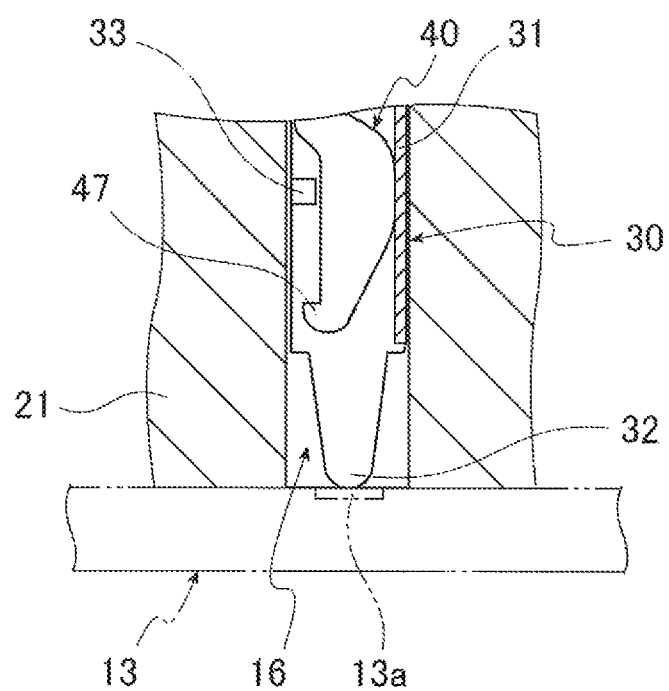
FIG. 6B is the longitudinal section showing a state where the first contact portion of the first plunger is projected when the socket for electrical components according to the first embodiment is used and shows a state where the socket for electrical components is arranged on the wiring substrate.

The contact pin 16 electrically connects the spherical terminal 12a of the IC package 12 (refer to FIG. 7B) to the pad 13a of the wiring substrate 13 (refer to FIG. 6B).

Figure 3A:
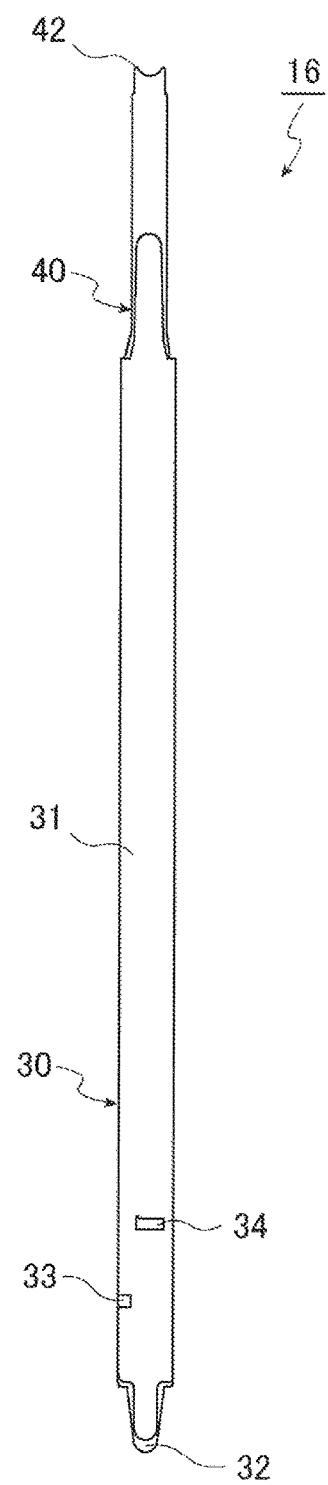
FIG. 3A is a front view showing a contact pin according to the first embodiment.
Figure 3B:
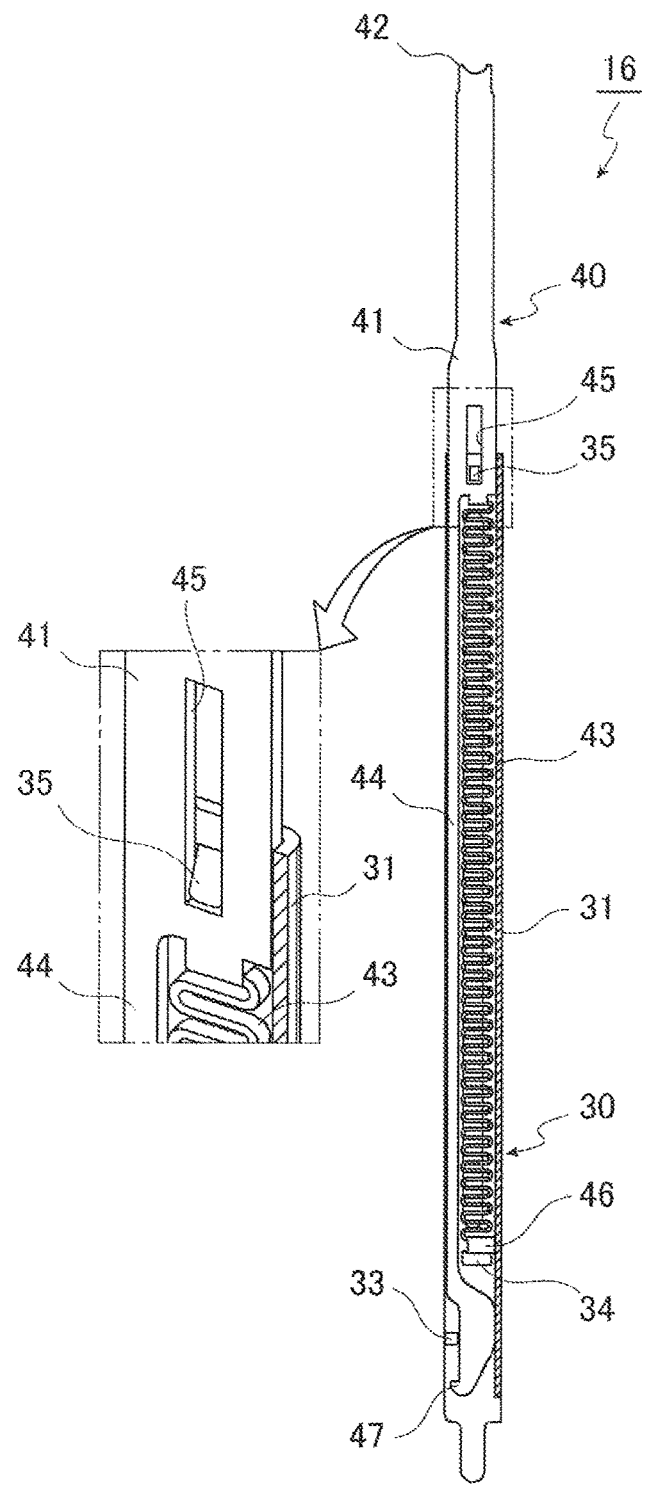
FIG. 3B is a longitudinal section showing the contact pin according to the first embodiment.
Figure 4A:
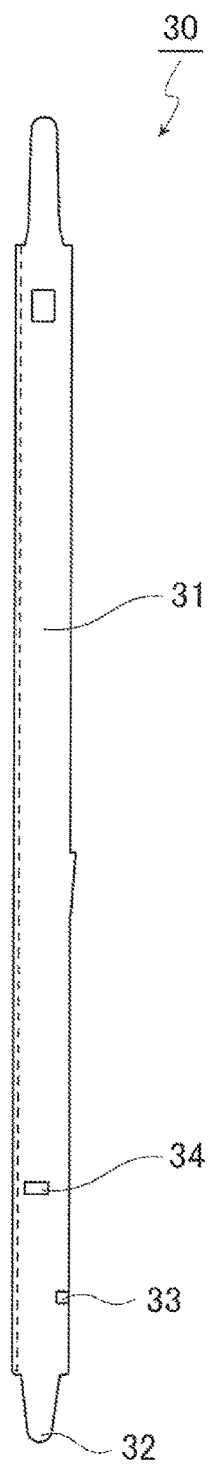
FIG. 4A is a front view showing a first plunger of the contact pin according to the first embodiment.
Figure 4B:
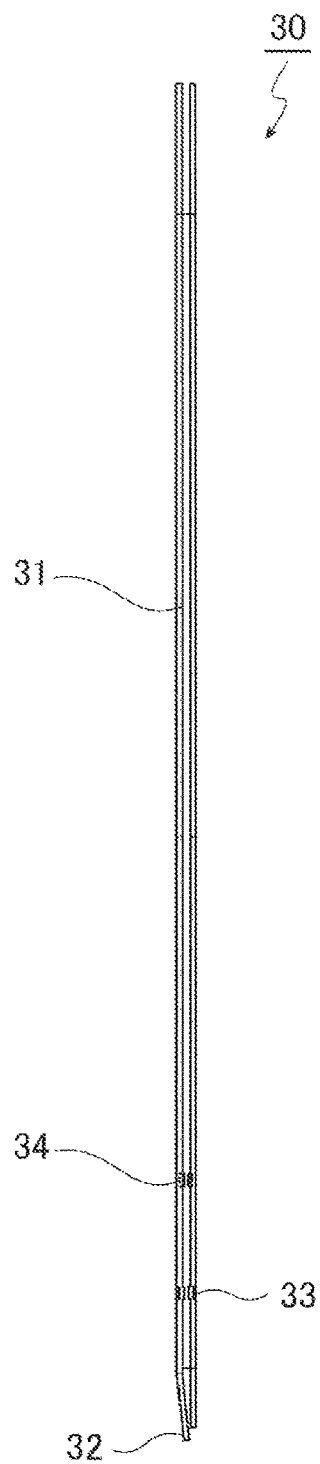
FIG. 4B is a right side view showing the first plunger of the contact pin according to the first embodiment.
Figure 4C:
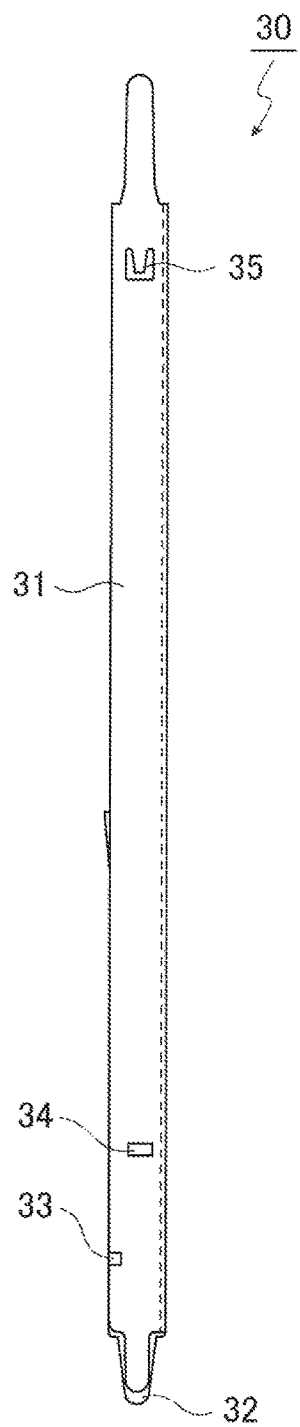
FIG. 4C is a rear view showing the first plunger of the contact pin according to the first embodiment.
Figure 4D:
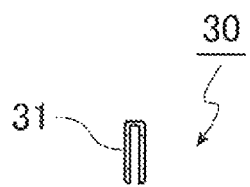
FIG. 4D is a plan view showing the first plunger of the contact pin according to the first embodiment.

As shown in FIGS. 3A and 3B, the contact pin 16 includes first and second conductive plungers 30 and 40. The first plunger 30 includes a first contact portion 32 which contacts with the pad 13a of the wiring substrate 13 (refer to FIG. 6B). The second plunger 40 includes a second contact portion 42 which contacts with two points of the spherical terminal 12a of the IC package 12 (refer to FIG. 7B), while being vertically movably supported with respect to the first plunger 30.

As shown in FIG. 4A to 4D, the first plunger 30 includes a plunger main body 31 whose cross section is approximately U shaped. The first contact portion 32 is formed on the lower end of the plunger main body 31 and a lockable portion 33 and a portion to be pressed 34 are formed in the vicinity of the first contact portion 32 with the portions 33 and 34 projected inside. An engaging portion 35 is formed such that engaging portion 35 is cut and raised inward in the vicinity of the upper end of the plunger main body 31.

Figure 5A:
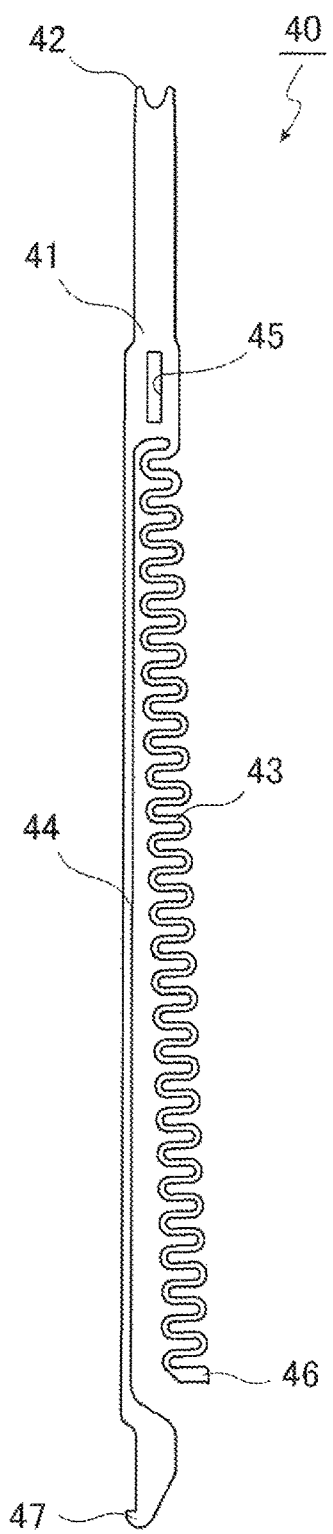
FIG. 5A is a front view showing a second plunger of the contact pin according to the first embodiment.
Figure 5B:
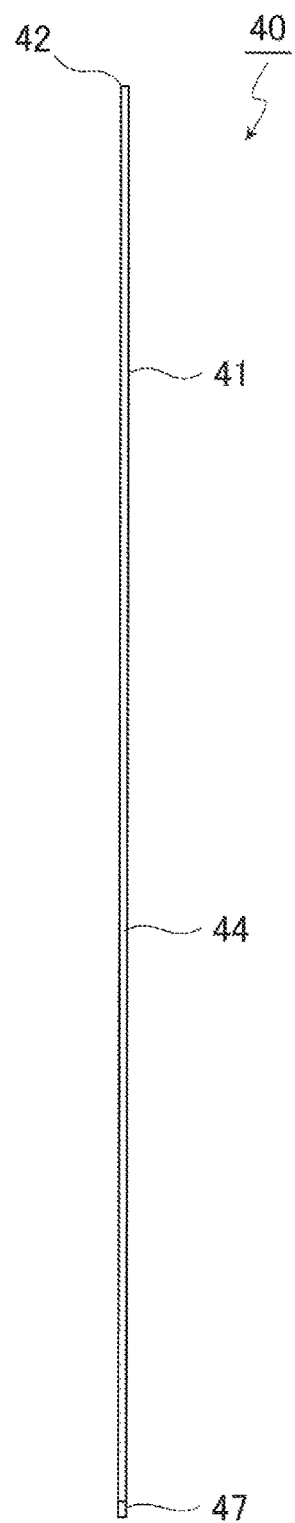
FIG. 5B is a left side view showing the second plunger of the contact pin according to the first embodiment.

As shown in FIGS. 5A and 58B, the second plunger 40 includes a plunger main body 41 which is substantially flat shaped and a second contact portion 42 is formed at the upper end of the plunger main body 41. An expandable/shrinkable meander portion 43 for elastically urging the first and second plungers 30 and 40 in the direction of separating them from each other (upward and downward) is integrally formed at the lower portion of the plunger main body 41 and a bar shaped contact piece 44 for conducting electricity between the first and second plungers 30 and 40 is provided to guide the expanding operation of the meander portion 43 when the meander portion 43 is expanded and/or shrunk.

The contact piece 44 is provided along the meander portion 43 in the vicinity of an opening portion of the plunger main body 31, whose cross section is approximately U shaped, of the first plunger 30. A pressure portion 46 is formed at the lower end of the meander portion 43 such that the pressure portion 46 is pressed to the portion to be pressed 34 of the first plunger 30. A hook-shaped lock portion 47 is formed at the lower end of the contact piece 44 such that the hook-shaped lock portion 47 is locked by the lockable portion 33 of the first plunger 30. Furthermore, an engageable portion 45 with a rectangular opening long in the vertical direction is formed at the approximate center portion of the plunger main body 41.

The expansion and shrinkage operation of the meander portion 43 is guided by surrounding four sides in the horizontal direction of the meander portion 43 by the plunger main body 31 of the first plunger 30 and the contact piece 44 of the second plunger 40 when the meander portion 43 of the second plunger 40 is expanded and/or shrunk.

As shown in FIGS. 3A and 3B, the lock portion 47 of the second plunger 40 is locked by the lockable portion 33 of the first plunger 30 and the engaging portion 35 of the first plunger 30 is engaged with the engageable portion 45 of the second plunger 40, which guides the vertical operation of the second plunger 40 with respect to the first plunger 30.

As shown in FIGS. 1, 2A, and 2B, the module main body 17 includes a substantially flat shaped lower plate 21, a substantially flat shaped upper plate 22, a substantially flat shaped floating plate 24, two substantially square frame-shaped spacers 25 and 26, and six substantially cylindrical connecting pins 27. The lower plate 21, the spacer 25, the upper plate 22, and the spacer 26 are stacked in this order and fixed and the connecting pins 27 are vertically penetrated through the peripheral portion thereof. Furthermore, a floating plate 24 is supported above the upper plate 22 and vertically movable only within a predetermined stroke S1 (refer to FIGS. 2A and 7A) with respect to the lower plate 21 with the floating plate 24 urged upward by a coil spring (not shown). As shown in FIG. 7, a plurality of circular pin insertion through-holes 24a vertically penetrated, into which the upper portion of the second plunger 40 of the contact pin 16 is vertically movably inserted, is formed in the floating plate 24. As shown in FIG. 1, a package housing portion 24c for housing the IC package 12 is formed on the upper surface of the floating plate 24 and eight guide pins 24b are provided around the package housing portion 24c.

As shown in FIG. 3B, the contact pin 16 is configured such that the lower end portion of the contact piece 44 of the second plunger 40 is brought into contact with the lower end portion of the plunger main body 31 of the first plunger 30 to electrically connect the first plunger 30 to the second plunger 40 via the contact piece 44 when the spherical terminal 12a of the IC package 12 is electrically connected to the pad 13a of the wiring substrate 13 and the meander portion 43 is shrunk to produce a predetermined repulsive force, bringing the first contact portion 32 of the first plunger 30 and the second contact portion 42 of the second plunger 40 into contact with the pad 13a of the wiring substrate 13 and the spherical terminal 12a of the IC package 12 at a predetermined contact pressure respectively.

When the contact pin 16 is assembled, the following steps are considered, for example.

A flat metal sheet in a predetermined shape is subjected to bending processing to produce the first plunger 30. Specifically, the metal sheet is subjected to half blanking to form the lockable portion 33 and the portion to be pressed 34 and bent to an approximately U-shape in its cross section. As described later, the engaging portion 35 of the first plunger 30 is formed such that the engaging portion 35 is cut and raised when the second plunger 40 is assembled to the first plunger 30.

A flat metal sheet in a predetermined shape is subjected to press working to produce the second plunger 40.

Then, the second plunger 40 is assembled to the first plunger 30 to complete the contact pins 16. Specifically, the leading edge of the second plunger 40 is obliquely inserted into the plunger main body 31 of the first plunger 30 to lock the lock portion 47 of the second plunger 40 to the lockable portion 33 of the first plunger 30. Thereby, the lock portion 47 of the second plunger 40 is locked by the lockable portion 33 of the first plunger 30 to prevent the first and second plungers 30 and 40 from separating. In this state, the second plunger 40 is rotated around the center of the lock portion 47 and housed in the plunger main body 31 of the first plunger 30 and the engaging portion 35 of the first plunger 30 is cut and raised inward to be engaged to the engageable portion 45 of the second plunger 40. Thereby, the second plunger 40 does not relatively oscillate with respect to the first plunger 30, which allows the vertical movement of the second plunger 40 to be guided with respect to the first plunger 30 when the IC socket 11 is used. At this point, the assemble work for the contact pin 16 is completed.

Thus, in assembling the contact pin 16, the lock portion 47 of the second plunger 40 is locked by the lockable portion 33 of the first plunger 30 to prevent the first and second plungers 30 and 40 from separating and the engaging portion 35 of the first plunger 30 is engaged with the engageable portion 45 of the second plunger 40 to prevent the second plunger 40 from relatively oscillating with respect to the first plunger 30. This eliminates the need for caulking the first and second plungers 30 and 40 to simplify the assembly of the contact pin 16. This also facilitates handling of the first and second plungers 30 and 40 to allow the contact pin 16 to be accurately assembled if the contact pin 16 in particular is small.

A method of using the IC socket 11 is described below with respect to FIGS. 6A to 7B.

As shown in FIG. 6A, the IC socket 11 is arranged on the wiring substrate 13 with the first contact portion 32 of the first plunger 30 of the IC socket 11 projected downward from the lower surface of the lower plate 21 of the module main body 17. Then, the contact pin 16 is elevated because the first plunger 30 contacts the pad 13a of the wiring substrate 13, so that, as shown in FIG. 6B, the first contact portion 32 of the first plunger 30 moves upward to be substantially flushed with the lower surface of the lower plate 21 of the module main body 17.

After that, the IC package 12 is conveyed by an automatic machine (not shown), put on the IC socket 11, and pressed downward by a pressing member (not shown). Then, as shown in FIGS. 7A and 7B, the spherical terminal 12a of the IC package 12 is brought into contact with two points of the second contact portion 42 of the second plunger 40 of the contact pin 16 to depress the second contact portion 42, lowering the second plunger 40 with respect to the first plunger 30. However, the meander portion 43 of the second plunger 40 is vertically shrunk according as the second contact portion 42 lowers because the pressure portion 46 at the lower end portion thereof is pressed against the portion to be pressed 34 of the first plunger 30, which increases force elastically urging the first and second plungers 30 and 40 in the direction of separating the plungers from each other (that is, in the vertical direction).

When the meander portion 43 of the second plunger 40 is vertically shrunk, the contact piece 44 guides the operation of the meander portion 43. Moreover, in the contact pin 16, the plunger main body 31, whose cross section is approximately U-shaped, of the first plunger 30 surrounds the meander portion 43 of the second plunger 40 and guides the operation of the meander portion 43, in addition, the contact piece 44 of the second plunger 40 surrounds the periphery of the plunger main body 31, whose cross section is approximately U-shaped, of the first plunger 30 and the meander portion 43 of the second plunger 40. For this reason, the meander portion 43 can be prevented from oscillating from side to side when the meander portion 43 of the second plunger 40 is shrunk. Therefore, this can avoid such a situation that the pad 13a cannot be appropriately connected to the spherical terminal 12a because of lack of contact pressure when the pad 13a of the wiring substrate 13 is electrically connected to the spherical terminal 12a of the IC package 12 by the contact pin 16. As a result, the contact pin 16 causes the first contact portion 32 of the first plunger 30 to contact the pad 13a of the wiring substrate 13 at a predetermined contact pressure and the second contact portion 42 of the second plunger 40 to contact the spherical terminal 12a of the IC package 12 at a predetermined contact pressure.

As described above, the engageable portion 45 of the second plunger 40 has a rectangular opening long in the vertical direction to allow the second plunger 40 to descend without trouble.

In this state, a current is flown to the IC package 12 to conduct a burn-in test.

At this point, a current flows between the spherical terminal 12a of the IC package 12 and the pad 13a of the wiring substrate 13 via the contact pin 16 of the IC socket 11, however, as described above, the contact pin 16 is brought into contact with the pad 13a of the wiring substrate 13 and the spherical terminal 12a of the IC package 12 at a predetermined contact pressure, which allows a burn-in test to be appropriately conducted.

As shown in FIG. 3B, the horizontal movement of the second plunger 40 of the contact pin 16 is restricted in such a manner that the engaging portion 35 of the first plunger 30 is engaged with the engageable portion 45 of the second plunger 40, so that the upper portion of the second plunger 40 cannot be horizontally oscillated to allow the burn-in test to be appropriately conducted.

As an electrical circuit in the contact pin 16, there are mainly considered a first electrical circuit via the plunger main body 31 of the first plunger 30 (specifically, an electrical circuit for connecting the second contact portion 42 of the second plunger 40 and the plunger main body 41 with the first contact portion 32 of the first plunger 30 via the plunger main body 31), and a second electrical circuit via the contact piece 44 of the second plunger 40 (specifically, an electrical circuit for connecting the second contact portion 42 of the second plunger 40 and the plunger main body 41 with the plunger main body 31 and the first contact portion 32 of the first plunger 30 via the contact piece 44). This is because, when the meander portion 43 of the second plunger 40 is compared with the contact piece 44 thereof, the meander portion 43 is slenderer than the contact piece 44 (the meander portion 43 is smaller in cross section area and longer in total length), therefore, the meander portion 43 is greater than the contact piece 44 in resistance to make it difficult for current to flow through the meander portion 43. As a result, this can prevent such a failure that a large current flows through the meander portion 43 to burn out the meander portion 43.

In addition, as described above, the first plunger 30 of the contact pin 16 is approximately U-shaped in cross section, so that the first plunger 30 can be made greater in cross section than a plunger which is for example approximately I-shaped in cross section, to allow resistance to be reduced.

The above first embodiment describes the module main body 17 including the lower plate 21, the upper plate 22, and the floating plate 24, however, the present invention can also be applied to other module main-bodies different in configuration (for example, the one without the floating plate 24, or the one provided with one or more center plates between the lower plate 21 and the upper plate 22.

The above first embodiment describes the second contact portion 42 with two contact points, of the second plunger 40, however, the second contact portion 42 different in configuration may be applied.

The above first embodiment describes a case where the half blanking is applied to form the lockable portion 33 and the portion to be pressed 34 of the first plunger 30, however, other different processing methods excluding the half blanking may be used instead.

The above first embodiment describes a case where the engaging portion 35 of the first plunger 30 is formed by the cutting and raising processing, however, other different processing methods excluding the cutting and raising processing may be used instead.

In the above first embodiment, the present invention is applied to the IC socket 11 serving as a "socket for the electrical components", nevertheless, the present invention can be applied to other apparatuses.

What is claimed is:

1. A contact pin configured to electrically connect a first electrical component to a second electrical component comprising:
   a first conductive plunger with a plunger main body substantially U-shaped in cross-section and a first contact portion which contacts with the first electrical component; and
   a second conductive plunger with a second contact portion which contacts with the second electrical component while being vertically movably supported with respect to the first plunger; wherein
   an expandable/shrinkable meander portion configured to elastically urge the first and second plungers in a direction of separating the first and second plungers from each other is integrally formed in the second plunger, a bar shaped contact piece configured to conduct electricity between the first and second plungers is provided along the meander portion in a vicinity of an opening portion of the plunger main body, and the expansion and shrinkage operation of the meander portion is guided by surrounding four sides in a horizontal direction of the meander portion with the plunger main body and the contact piece when the meander portion is expanded and/or shrunk,
   when the first electrical component and the second electrical component are electrically connected to each other, the first and second plungers are mutually conducted via the contact piece, and the meander portion is shrunk to produce a predetermined repulsive force, bringing the first contact portion of the first plunger and the second contact portion of the second plunger into contact with the first and second electrical components at predetermined contact pressures respectively.

2. The contact pin according to claim 1, wherein,
   a lock portion is formed at a leading edge of the contact piece, a lockable portion is formed in the first plunger, and the lock portion is locked by the lockable portion,
   an engaging portion is formed on one of the first or second plungers, a engageable portion is formed on an other thereof, and the engaging portion is engaged with the engageable portion to guide a vertical movement of the second plunger with respect to the first plunger.

3. A socket for electrical components, wherein
   a plurality of contact pins according to claim 1 are arranged on a module main body.

* * * * *